(12) United States Patent
Ribo et al.

(10) Patent No.: US 9,912,468 B1
(45) Date of Patent: Mar. 6, 2018

(54) MULTI-DATA RATES MULTI-PROTOCOL COMMUNICATIONS TECHNIQUES FOR REFERENCE-LESS RE-TIMER

(71) Applicant: Keyssa Systems, Inc., Campbell, CA (US)

(72) Inventors: Jerome Jean Ribo, San Jose, CA (US); Bruno Tourette, Cupertino, CA (US)

(73) Assignee: Keyssa Systems, Inc., Campbell, CA (US)

( * ) Notice: Subject to any disclaimer, the term of this patent is extended or adjusted under 35 U.S.C. 154(b) by 0 days.

(21) Appl. No.: 15/240,265

(22) Filed: Aug. 18, 2016

(51) Int. Cl.
| | | |
|---|---|---|
| *H04L 7/00* | (2006.01) | |
| *H04L 7/027* | (2006.01) | |
| *H04L 29/06* | (2006.01) | |

(52) U.S. Cl.
CPC ............ *H04L 7/0087* (2013.01); *H04L 7/027* (2013.01); *H04L 69/28* (2013.01); *H04L 69/18* (2013.01)

(58) Field of Classification Search
CPC ....... H04L 7/0087; H04L 69/28; H04L 7/027; H04L 69/18
See application file for complete search history.

(56) References Cited

U.S. PATENT DOCUMENTS

| | | | | |
|---|---|---|---|---|
| 7,308,060 | B1 * | 12/2007 | Wall ...................... | H03L 7/081 375/355 |
| 2003/0035504 | A1 * | 2/2003 | Wong ................... | H04L 25/242 375/377 |
| 2008/0192873 | A1 * | 8/2008 | Tamura ................. | H04L 7/0338 375/355 |
| 2010/0030503 | A1 * | 2/2010 | Cranford, Jr. .......... | G01R 29/26 702/69 |

* cited by examiner

*Primary Examiner* — Vineeta Panwalkar
(74) *Attorney, Agent, or Firm* — Fish & Richardson P.C.

(57) ABSTRACT

Systems, methods, and apparatus for generating a clock signal using re-timer circuitry, including receiving an input data signal transmitted without a reference clock signal; comparing the input data signal with a re-timer clock signal to determine a frequency difference between the input data signal and the re-timer clock signal; determining a data rate of the input data signal based on the frequency difference between the input data signal and the re-timer clock signal; and generating, based on the data rate of the input data signal, a control signal for adjusting a frequency of the re-timer clock signal to frequency-lock the re-timer clock signal with the input data signal.

30 Claims, 6 Drawing Sheets

| Initial Re-timer Rate = 6 Gbps | | | Initial Re-timer Rate = 5.4 Gbps | | | ... | Initial Re-timer Rate = 5 Gbps | | |
|---|---|---|---|---|---|---|---|---|---|
| Protocol 1 | | | Protocol 2 | | | | Protocol N | | |
| Full Rate | Density | Target Data Rate | Full Rate | Density | Target Data Rate | | Full Rate | Density | Target Data Rate |
| Preamble 1 | 35% | 6 Gbps | Preamble 1 | 50% | 5.4 Gbps | | Preamble 1 | 34% | 5 Gbps |
| Preamble 2 | none | none | Preamble 2 | none | none | | Preamble 2 | 39% | 5 Gbps |
| ... | | | ... | | | | ... | | |
| Preamble m | none | none | Preamble j | none | none | | Preamble k | 41% | 5 Gbps |
| Half Rate | | | Half Rate | | | | | | |
| Preamble 1 | 18% | 3 Gbps | Preamble 1 | 25% | 2.7 Gbps | | | | |
| Preamble 2 | none | none | Preamble 2 | none | none | | | | |
| ... | | | ... | | | | | | |
| Preamble m | none | none | Preamble j | none | none | | | | |
| Quarter Rate | | | | | | | | | |
| Preamble 1 | 8.7% | 1.5 Gbps | | | | | | | |
| Preamble 2 | none | none | | | | | | | |
| ... | | | | | | | | | |
| Preamble m | none | none | | | | | | | |

FIG. 4

MULTI-DATA RATES MULTI-PROTOCOL COMMUNICATIONS TECHNIQUES FOR REFERENCE-LESS RE-TIMER

BACKGROUND

This specification relates to re-timer circuitry for data communications.

Conventionally, to synchronize data transmissions between a transmitter and receiver, a reference clock signal may be transmitted with a data signal. In general, growth in bandwidth in modern data transmission follows a logarithm law, and network and point-to-point connections favor high-speed data transfers without a reference clock signal.

A re-timer typically recovers the reference clock signal at the receiving end of the high-speed data transfer, where a reference oscillator may be used. In general, data transmission includes identifying data patterns, such as a preamble, that provides usage and protocol information. However, the identifying data patterns typically cannot be read until a clock is recovered. Conventionally, to recover the reference clock signal, the data rate of the data signal needs to be specified at the re-timer prior to receiving the data signal. However, a reference-less re-timer is preferable because such a design would allow for dynamic adaptation to multiple data rates and/or multiple data protocols.

SUMMARY

In general, one innovative aspect of the subject matter described in this specification can be embodied in methods that include the actions of receiving an input data signal transmitted without a reference clock signal; comparing the input data signal with a re-timer clock signal to determine a frequency difference between the input data signal and the re-timer clock signal; determining a data rate or preamble of the input data signal based on the frequency difference between the input data signal and the re-timer clock signal; and generating, based on the data rate of the input data signal, a control signal for adjusting a frequency of the re-timer clock signal to frequency-lock the re-timer clock signal with the input data signal.

To receive the input data signal, a preamble portion of the input data signal may be received. To determine the frequency difference between the input data signal and the re-timer clock signal, a data edge density of the preamble portion of the input data signal may be determined using the re-timer clock signal. The frequency difference between the input data signal and the re-timer clock signal may be determined based on the data edge density. To determine the data rate of the input data signal, the data rate of the input data signal may be determined based on the determined data edge density of the input data signal and an assumption on the data edge density that is associated with the frequency of the re-timer clock signal.

The assumption on the data edge density may be associated with a particular data rate of a particular transmission protocol. To determine the data rate of the input data signal based on the determined data edge density of the input data signal and the assumption on the data edge density, it may be determined that a difference between the determined data edge density of the input data signal and the assumption on the data edge density satisfies a threshold condition. In response to determining that the difference between the determined data edge density of the input data signal and the assumption on the data edge density satisfies the threshold condition, the particular data rate of the particular transmission protocol to the input data signal may be assigned. In response to determining that the difference between the determined data edge density of the input data signal and the assumption on the data edge density satisfies the threshold condition, the particular transmission protocol to the input data signal may be assigned.

To determine that the difference between the determined data edge density of the input data signal and the assumption on the data edge density satisfies the threshold condition, the assumption on the data edge density may be obtained from a lookup table that stores data edge density information associated with multiple transmission protocols. To obtain the assumption on the data edge density from the lookup table, it may be determined, based on the preamble portion of the input data signal, that the input data signal was encoded based on the particular transmission protocol. In response to determining that the input data signal was encoded based on the particular transmission protocol, the assumption on the data edge density may be obtained from the lookup table.

To determine the data edge density of the preamble portion of the input data signal using the re-timer clock signal, a number of data edge transitions of the preamble portion of the input data signal that occur within a predetermined number of clock cycles of the re-timer clock signal may be determined. To generate the control signal for adjusting the frequency of the re-timer clock signal, the control signal for adjusting the frequency of the re-timer clock signal to frequency-lock with the input data signal may be generated before receiving a data payload portion of the data signal.

A trigger signal may be received. To compare the input data signal with the re-timer clock signal, the input data signal may be compared with the re-timer clock signal to determine the frequency difference between the input data signal and the re-timer clock signal in response to receiving the trigger signal.

To generate a control signal for adjusting a frequency of the re-timer clock signal, a first control signal to generate a first frequency of the re-timer clock signal may be generated. A first frequency difference between the first frequency and a frequency of the input data signal may be determined. A second control signal to generate a second frequency of the re-timer clock signal having a second frequency difference between the second frequency and the frequency of the input data signal that is smaller than the first frequency difference may be generated based on the first frequency difference. The control signal may be a capacitance calibration signal for driving a voltage-controlled oscillator.

Advantageous implementations may include one or more of the following features. A reference-less re-timer may support data transmissions without a reference clock signal. A reference-less re-timer may dynamically detect the data rate and/or the data protocol of the transmission. A reference-less re-timer may use preamble information in a data signal to calibrate a controlled oscillator before the payload is received. The oscillator may be calibrated in real time, which reduces costs associated with advanced calibration. Fewer components are necessary for detecting data transmission without a clock signal. The recovered clock signal may be used by another circuitry to recover data in the data signal. The self-discovery, during the learning process, of the data density allows the frequency to be monitored until the frequency locks.

The details of one or more embodiments of the invention are set forth in the accompanying drawings and the descrip-

BRIEF DESCRIPTION OF DRAWINGS

FIG. 4 is an example lookup table for protocol disambiguation based on data edge density.

Like reference symbols in the various drawings indicate like elements.

DETAILED DESCRIPTION

This specification describes a re-timer for providing a clock signal in data transmissions. In particular, this specification describes a reference-less re-timer that dynamically calibrates an oscillator according to the received data signal to support multi-protocols and/or multi-data rates transmissions, where a transmission of a reference clock signal is not required. The re-timer described in this specification may be used in wired communications, wireless communications and/or contactless communications. Wired communications may include signal communications between components on a device, between devices, or between systems using electrical or optical cables. Wireless and contactless communications may include signal communications between components on a device, between devices, or between systems without the use of cables. For example, tightly-coupled transmitter/receiver pairs may be deployed with a transmitter disposed at a terminal portion of a first conduction path and a receiver disposed at a terminal portion of a second conduction path. The transmitter and receiver may be disposed in close proximity to each other depending on the strength of the transmitted energy, and the first conduction path and the second conduction path may not be contiguous with respect to each other.

Figure 1:
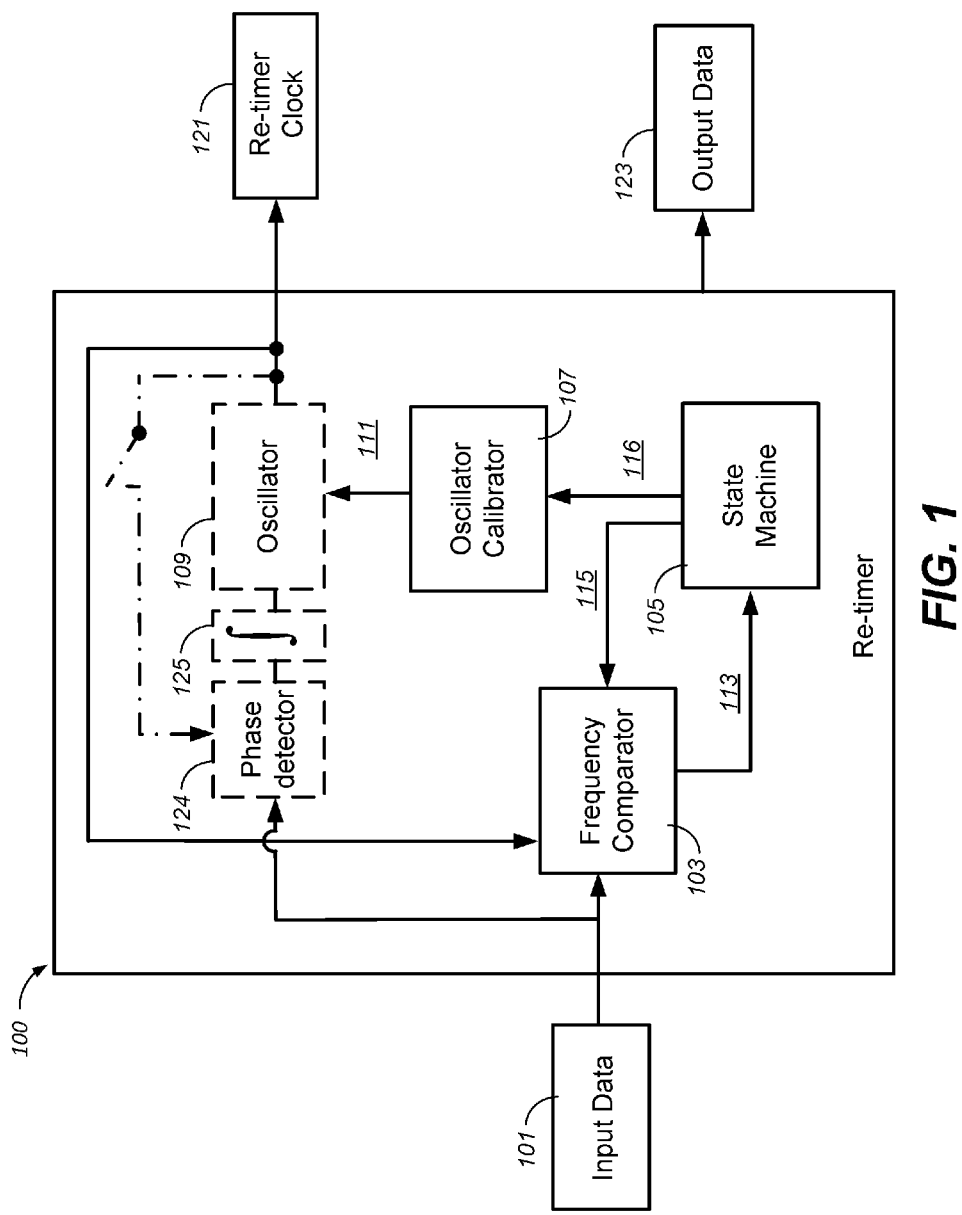
FIG. 1 is a block diagram of an example re-timer.

FIG. 1 shows an example re-timer 100. The re-timer 100 may be an apparatus, a system, a sub-system of a system, circuitry that performs the functions described below, or any combination thereof. In general, the re-timer 100 receives an input data signal 101 without a reference clock signal, and generates a control signal 111 for generating a re-timer clock signal 121 that can be used to sample data in the input data signal 101. In general, information in the input data signal 101 is encoded by an encoder at a particular data rate. For example, the input data signal 101 may include information encoded at 40 Gigabits-per-second (Gbps), 20 Gbps, 10 Gbps, 100 Megabits-per-second (Mbps), or any other suitable data rate. In some implementations, information in the input data signal 101 may include a preamble portion and a data payload portion. The preamble portion includes information that may be used to establish a transmission link and determine the clock cycle of the incoming signals. For example, the preamble portion may be a header of a data stream. The data payload portion includes the actual data to be exchanged over the transmission link. For example, the data payload portion may be image data, video data, voice data, or any other data that may be processed by a receiver of the transmission link. The re-timer 100 may use the preamble portion of the input data signal 101 to calibrate the oscillator 109. The control signal 111 may use the calibrated oscillator to regenerate the re-timer clock signal 121, such that a receiver may sample the data portion of the input data signal 101 with the re-timer clock signal 121.

The re-timer 100 includes a frequency comparator 103, a state machine 105, and an oscillator calibrator 107. In some implementations, the re-timer 100 may include an oscillator 109, such as a voltage-controlled oscillator (VCO), for generating the re-timer clock signal 121. Once the oscillator 109 is calibrated, the oscillator 109 may be continuously controlled by directives provided by a phase director 124 and filtered by an integrator 125. Once calibrated, the oscillator will be continuously controlled by the directives provided by a phase detector 124 and filtered by an integrator 125.

In general, the frequency comparator 103 includes circuitry that is configured to compare the input data signal 101 and the re-timer clock signal 121 to determine a frequency difference 113 between the input data signal 101 and the re-timer clock signal 121. The frequency comparator 103 may also determine whether the input data signal 101 frequency-locks with the re-timer clock signal 121. In general, a first signal frequency-locks with a second signal when a frequency of the first signal substantially matches a frequency of the second signal.

Figure 3:
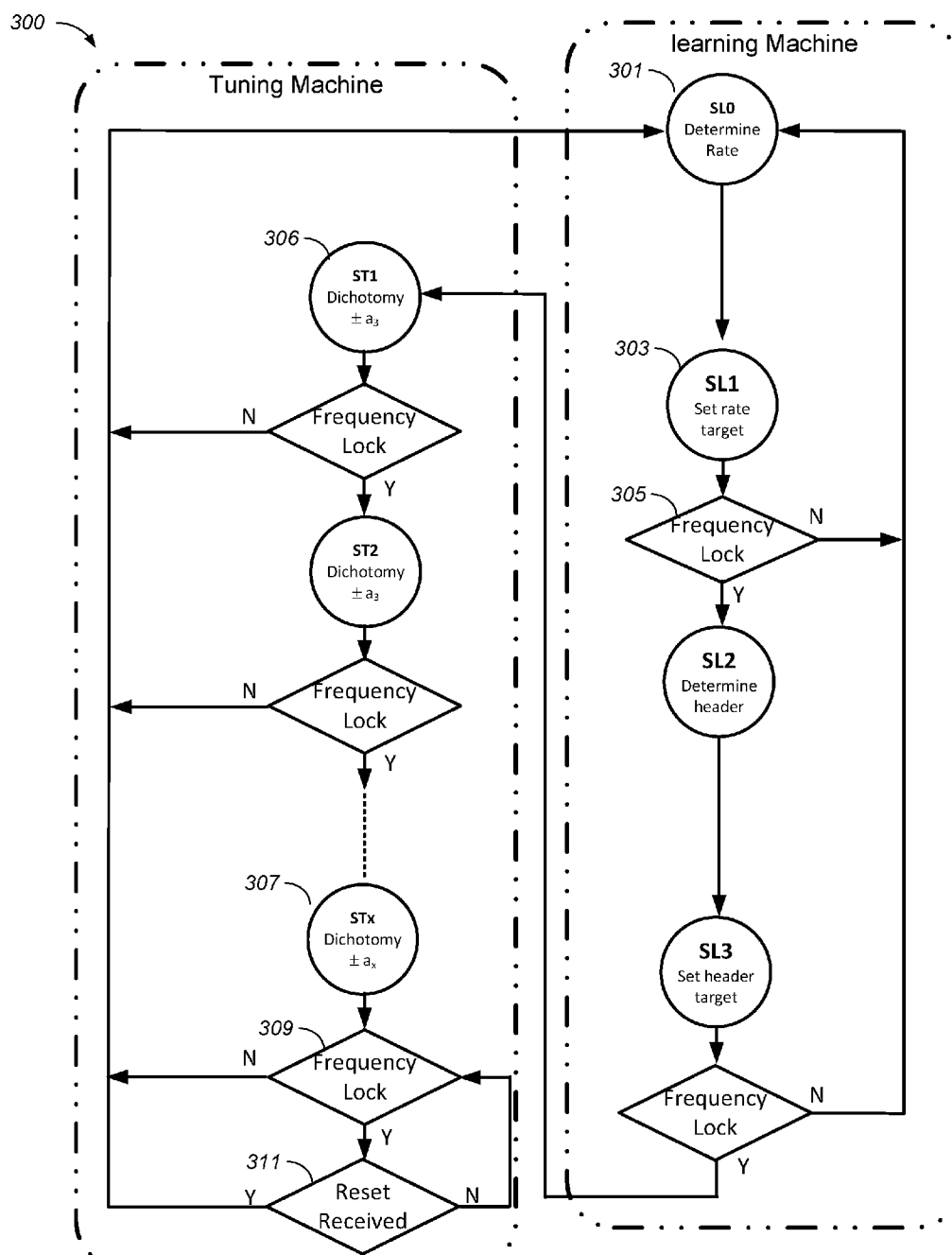
FIG. 3 is a state diagram of a state machine associated with a re-timer.

The state machine 105 includes circuitry that is configured to determine a data rate of the input data signal 101 based on a current state of the state machine 105 and the frequency difference 113 between the input data signal 101 and the re-timer clock signal 121. The state machine 105 may be represented by a state diagram having multiple states, where a transition from the current state to another state depends on the frequency difference 113 and/or whether the input data signal 101 frequency-locks with the re-timer clock signal 121. FIG. 3, described in more details below, is one example state diagram for the state machine 105.

In some implementations, information in the input data signal 101 may be encoded at a data rate according to a particular protocol. A particular protocol may support more than one possible data rate of which the information in the input data signal 101 may be encoded. For example, in the SATA protocol, the information in the input data signal 101 may be encoded at a full rate (e.g., 6 Gbps), at a half rate (e.g., 3 Gbps), or at a quarter rate (e.g., 1.5 Gbps). In some implementations, a particular protocol may be associated with multiple preambles, where each preamble may be associated with the same data rate. For example, an input data signal having a first preamble associated with a particular protocol may be encoded at a full rate of 6 Gbps, while an input data signal having a second preamble associated with the particular protocol may be encoded at a full rate of 5.1 Gbps. Based on the frequency difference 113 and the current state, the state machine 103 may be configured to determine a protocol used to encode the information in the input data signal 101 and the associated data rate.

The state machine 105 provides a target frequency signal 115 to the frequency comparator 103 and once the target frequency has been validated through the learning process, the state machine provides control signals 116 to the oscillator calibrator 107. Based on the target frequency signal 115, the oscillator calibrator 107 generates an oscillator control signal 111 to calibrate the oscillator 109, such that the re-timer clock signal 121 generated by the oscillator 109 is updated to have a frequency that corresponds to the determined data rate. The frequency comparator 103 compares the input data signal 101 with the updated re-timer clock signal 121 to determine an updated frequency difference 113, and the updated frequency difference 113 is provided to the state machine 105 for additional tuning of the re-timer clock signal 121, if required. In general, the frequency difference 113 between the input data signal 101 and the re-timer clock signal 121 would decrease over each iteration until the frequency difference 113 satisfies a threshold condition for the re-timer clock signal 121 to sample the input data signal 101. For example, the frequency difference 113 between the input data signal 101 and the re-timer clock signal 121 may decrease over each iteration until the frequency difference 113 is less than a predetermined value (e.g., within a 1% accuracy). At this point, the re-timer clock signal 121 may be fed back to the phase comparator 124 so the frequency of the input data signal 101 and the frequency of the re-timer clock signal 121 converge at a locked frequency used to accurately sample the input data signal 101.

The re-timer 100 may include circuitry that generates output data signal 123 based on the input data signal 101. For example, the re-timer 100 may include phase delay circuitry and buffer circuitry that adjust the phase of the data in the input data signal 101 to generate the output data signal 123, such that the phase of the data in the output data signal 123 aligns with the phase of the re-timer clock signal 121. The output data signal 123 and the re-timer clock signal 121 may be received by another circuitry (e.g., a decoder) that processes the data.

Figure 2:
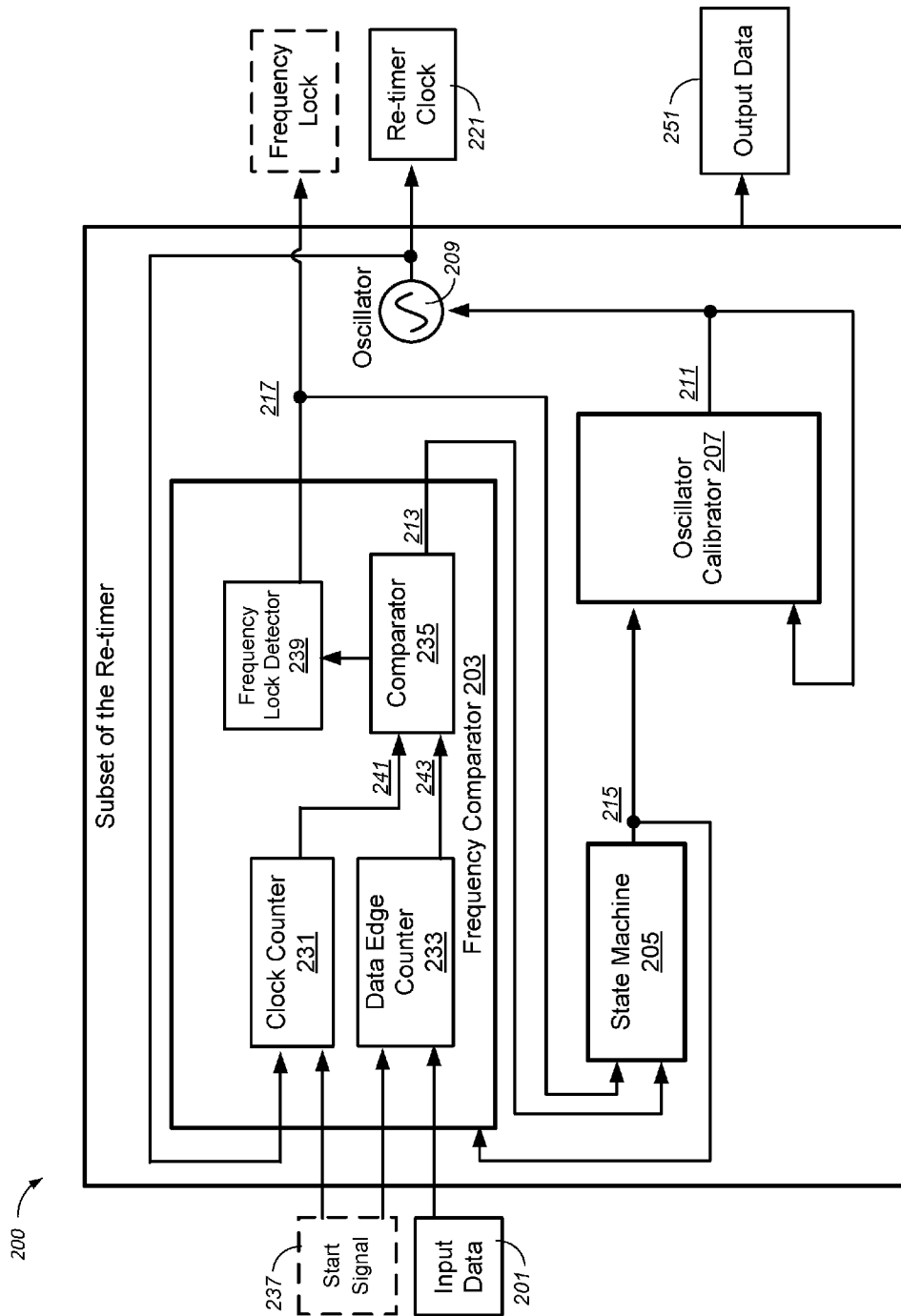
FIG. 2 is a block diagram of an example partial re-timer for protocol disambiguation and oscillator calibration.

FIG. 2 shows a block diagram of an example data processing machine 200 for protocol disambiguation and oscillator calibration. The implementation of the data processing machine 200 may be part of the re-timer 100, but is not limited to the descriptions of the re-timer 100. In general, the data processing machine 200 receives an input data signal 201 without a reference clock signal, and generates an output clock signal 221 that can be used to sample the input data signal 201. The data processing machine 200 includes a frequency comparator 203, a state machine 205, an oscillator calibrator 207, and an oscillator 209.

The frequency comparator 203 is similar to the frequency comparator 103. The frequency comparator 203 is configured to compare the input data signal 201 and the re-timer clock signal 221 to determine a frequency difference between the input data signal 201 and the re-timer clock signal 221. The frequency comparator 203 may also be configured to determine whether the input data signal 201 frequency-locks the re-timer clock signal 221. The frequency comparator 203 includes a clock counter 231, a data edge counter 233, a comparator 235, and a frequency lock detector 239. The frequency lock detector 239 may be based only on the frequency difference between the clock counter 231 and the data edge counter 233. If the difference is within a predetermined threshold, the frequency may be locked. In general, the clock counter 231 provides a clock cycle count using the current re-timer clock signal 221 generated by the oscillator 209, and the data edge counter 233 detects the edge density of incoming data signal 201. The edge density may be any determined with any appropriate method. In some implementations, the edge density is determined by counting data edge transitions of the input data signal 201 within a period of time. For example, both counters 231 and 233 may start at the same time and run concurrently until a predetermined data count is reached. After the predetermined data count is reached, the comparator 235 may determine a delta signal based on the outputs of counters 231 and 233. In some other implementations, the edge density is determined by using preamble data from the input data signal 201.

The clock counter 231 is configured to receive a re-timer clock signal 221 and to count a number of received clock cycles. The clock counter 231 may be implemented using circuitry that receives the re-timer clock signal 221 and counts a number of received clock cycles. For example, the clock counter 231 may be an asynchronous counter. The clock counter 231 may be a count-up counter or a count-down counter. In some implementations, the clock counter 231 is configured to count received clock cycles for a specific amount of time. In some implementations, the clock counter 231 is configured to count clock cycles until a specific count has been reached. For example, the clock counter 231 may be configured to count clock cycles until 4096 clock cycles have been reached. In some implementations, a number of the specific count may be set by an external signal. For example, the state machine 205 may assume that the input data signal 201 has been encoded by a particular protocol, which leads to an expected density. The extracted density, the density based on information acquired about the data density during the data edge count comparisons, is then compared to the expected density. The state machine 205 may provide a control signal 215 to the clock counter 231, where the control signal 215 includes information specifying the number of the specific count (i.e., 4096) that corresponds to the preamble associated with the particular protocol. In some implementations, the clock counter 231 generates a clock counter state signal 241. The clock counter state signal 241 may represent an operating state of the clock counter 231. For example, the clock counter state signal 241 may change from a logic 0 to a logic 1 upon completion of the counting. As another example, the clock counter state signal 241 may indicate the current count value of the clock counter 231.

The data edge counter 233 is configured to receive an input data signal 201 and to count a number of data edge transitions. The data edge counter 233 may be implemented using circuitry that receives the input data signal 201 and counts a number of data edge transitions. For example, the data edge counter 233 may be an asynchronous counter. The data edge counter 233 may be a count-up counter or a count-down counter. The data edge counter 233 may count rising edges, falling edges, or both. In some implementations, the data edge counter 233 is configured to count the data edge transitions for a specific amount of time. In some implementations, the data edge counter 233 is configured to count data edge transitions until a specific count has been reached at the clock counter 231. For example, the data edge counter 233 may be configured to count the number of data edge transitions until 4096 clock cycles have been reached at the clock counter 231. In some implementations, the data edge counter 233 outputs a data edge count signal 243. The data edge count signal 243 may represent an operating state of the data edge counter 233. For example, the data edge count signal 243 may indicate the current count value of the data edge counter 233.

In some implementations, the operations of the clock counter 231 and the data edge counter 233 may be triggered by a start signal 237. For example, a data detector may detect that the input data signal 201 is received. In response to detecting that the input data signal 201 is received, the data detector transmits the start signal 237 to the clock counter 231 and the data edge counter 233 to trigger the counting.

The comparator 235 is configured to receive the clock counter state signal 241 and the data edge count signal 243 and determine a density signal 213 of the input data signal 201 based on the clock counter state signal 241 and the data edge count signal 243. The comparator 235 may be implemented using circuitry that receives the clock counter state signal 241 and the data edge count signal 243 and determine the density signal 213. The density of the input data signal 201 provides an indication of the frequency difference between the input data signal 201 and the re-timer clock signal 221 because in many data transmission applications, the densities associated with preambles for different protocols are known. One example of a density of the input data signal 201 is a ratio between a number of data edge transitions as determined by the data edge counter 233 and a number of clock cycles as determined by the clock counter 231. For example, during the time that the clock counter 231 has counted 4096 clock cycles of a clock data pattern using the re-timer clock signal 221, the data edge counter 233 has counted 1024 data edge transitions using the input data signal 201. The density of the input data signal 201 is 25% of the clock data. Based on the percentage difference, the state machine may determine whether to learn more about the incoming data or calibrate the oscillator 207 to decrease the difference in a subsequent iteration. In some cases, the density determined by the comparator 235 may exceed 100%. In this case, the state machine may hypothesize another protocol header during the learning process. If the state machine determines that the original protocol assumption was correct, it may continue on to determine half and/or quarter rates, if any. For example, if the oscillator 209 has been calibrated to output a re-timer clock signal for sampling data encoded at 10 Gbps, but the data in the input data signal 101 has been encoded at 20 Gbps, a count of data edge transitions of the input data signal 101 may exceed a count of re-timer clock cycles, and thus providing a density of more than 100%.

The frequency lock detector 239 is configured to receive the delta count between the input data signal 201 and the re-timer clock signal 221 and to determine whether the input data signal 201 is frequency-locked with the re-timer clock signal 221. For example, if comparator 235 determines the count difference is within 5% accuracy, the frequency may be coarsely locked. At this point, the state machine may end its learning process and initiate calibrator tuning. Calibrator tuning may continue until the frequency difference is within 1%. In response to determining that the input data signal 201 is frequency-locked with the re-timer clock signal 221, the frequency lock detector 239 may generate a frequency lock signal 217 to indicate that the input data signal 201 is frequency-locked with the re-timer clock signal 221. In response to determining that the input data signal 201 is not frequency-locked with the re-timer clock signal 221, the frequency lock detector 239 may generate a frequency lock signal 217 to indicate that the input data signal 201 is not frequency-locked with the re-timer clock signal 221. In some implementations, the re-timer 200 may output the frequency lock signal 217 to a different circuitry, such that the different circuitry may determine whether the re-timer clock signal 221 is frequency-locked with the input data signal 201. In some implementations, the frequency lock signal 217 may also indicate a frequency difference between the re-timer clock signal 221 and the input data signal 201.

The state machine 205 is similar to the state machine 105. The state machine 205 is configured to receive the density signal 213 and the frequency lock signal 217, and to determine a data rate of the input data 201 based on a current state of the state machine 205, the density signal 213, and the frequency lock signal 217. The state machine 205 may be implemented using circuitry that determines a data rate of the input data signal 201 based on the current state of the state machine 205 and the density signal 213, and the frequency lock signal 217. In general, the state machine 205 is represented by a state diagram having multiple states, where a transition from the current state to another state depends on the density signal 213 and/or whether the input data signal 201 is frequency-locked with the re-timer clock signal 221.

FIG. 3 is one example state diagram 300 for the state machine 205 illustrating how the data rate of the input data signal 201 may be determined. The implementation of the state machine 205 is not limited to FIG. 3. At state SL0 (301), the state machine 205 determines a data rate for the input data signal 201. In some implementations, the state machine 205 determines the data rate based on the density of the input data signal 201 using a lookup table. FIG. 4 is one example lookup table 400 for protocol disambiguation based on data edge density. The lookup table 400 may be stored at the state machine 205, stored in a memory accessible by the state machine 205, or provided by an external signal. The implementation of the state machine 205 or the implementation of a lookup table that may be used by the state machine 205 is not limited to FIG. 4.

When the input data signal 201 is initially received, the re-timer 200 does not have information associated with the data rate of the input data signal 201. The state machine 205 may set an initial re-timer rate using initial re-timer rate information 401 stored in the lookup table 400. For example, the state machine 205 may set an initial re-timer rate of 5 Gbps. The state machine 205 generates a control signal 215 to the oscillator calibrator 207, and the oscillator calibrator 207 sends an oscillator control signal 211 to calibrate the oscillator 209 to generate a re-timer clock signal 221 at a rate of 5 Gbps. The frequency comparator 203 may determine a density of the input data signal 201 based on the input data signal 201 and the 5 Gbps re-timer clock signal 221, and the frequency comparator 203 may send the density information to the state machine 205 using the density signal 213.

Based on the density information, the state machine 205 may use the lookup table 400 to determine a data rate and/or a protocol header of the input signal 201. For example, the lookup table 400 stores information for N different protocols, where N is an integer. Each protocol may support different preambles, where each preamble may represent a different status (e.g., establishing handshake, error checking, data transfer, etc.) of the data transmission. For example, column 403 shows that protocol 1 supports m different preambles, where m is an integer. As another example, column 405 shows that protocol 2 supports j different preambles, where j is an integer. As another example, column 407 shows that protocol 3 supports k different preambles, where k is an integer.

A protocol may support different categories of data rates. For example, column 403 shows that protocol 1 supports encoding data at a full rate, a half rate, and a quarter rate. As another example, column 405 shows that protocol 2 supports encoding data at a full rate and a half rate, but not at a quarter rate. As another example, column 407 shows that protocol 3 supports encoding data at a full rate, but not at a half rate or at a quarter rate.

In some implementations, within a category (e.g., full rate), different preambles may support different data rates. For example, entry 403a shows that when data has been encoded with protocol 1 and preamble 1 at the full rate, the corresponding data rate is 6 Gbps. As another example, entry 403b shows that when data has been encoded with protocol 1 and preamble 2 at the half rate, the corresponding data rate is 3 Gbps. As another example, entry 403c shows that when data has been encoded with protocol 1 and preamble 1 at the quarter rate, the corresponding data rate is 1.5 Gbps (i.e., quarter of 6 Gbps).

Each entry of the lookup table 400 may be associated with corresponding density information. In some implementations, the density information stored in the lookup table 400 represents the expected density to be determined by the frequency comparator 203 based on the assumed data rate 401.

For example:
Entry 403a shows that assuming the initial re-timer clock signal 221 is calibrated at 6 Gbps and data in the input data signal 201 has been encoded with protocol 1, preamble 1 at the full rate, the expected density is 35%.
Entry 403b shows that assuming the re-timer clock signal 221 is calibrated at 6 Gbps and data in the input data signal 201 has been encoded with protocol 1, preamble 1 at the half rate, the expected density is 18%.
Entry 403c shows that assuming the re-timer clock signal 221 is calibrated at 6 Gbps and data in the input data signal 201 has been encoded with protocol 1, preamble 1 at the quarter rate, the expected density is 8.7% (i.e., a quarter of 35%) because only one quarter of the data edges is received at the re-timer 200 by the time that the clock counter 231 has completed the counting of the clock cycles.
Entry 407a shows that assuming the re-timer clock signal 221 is calibrated at 5 Gbps and data in the input data signal 201 has been encoded with protocol N, preamble 1 at the full rate, the expected density is 34%. Similarly, if the input data signal 201 has been encoded with protocol N, but preamble 2 at full rate, the expected density would be 39%. And an input data signal 201 encoded with protocol N, and with preamble k at full rate would be expected to have a density of 41%.

Based on the initial re-timer rate 401 and the determined density of the input data signal 201, the state machine 205 may estimate the target data rate using lookup table 400. For example, if the determined density is 25%, the state machine 205 may identify that the matching entry is entry 405b, and determine that the target data rate is 2.7 Gbps. The determined density of the input data signal 201 may not exactly match a look up table 400 entry. In some implementations, the state machine 205 may identify the entry that has the smallest difference from the determined density. For example, with protocol 1, if the determined density is 5%, the state machine 205 may identify that the closest matching entry is entry 403c, and determine that the target data rate is 1.5 Gbps. At state SL1, after the state machine 205 determines the target data rate, the state machine 205 generates a control signal 215 to the oscillator calibrator 207 (303).

In some implementations, based on a difference between the determined density and the density associated an entry, the state machine 205 may identify the entry if the difference satisfies a threshold difference condition. For example, with protocol 2, if the determined density is 54%, and if the threshold difference condition is satisfied when the threshold difference is less than or equal to 6%, the state machine 205 may identify that the closest matching entry is entry 405a, and determine that the target data rate is 5.4 Gbps. At this point, the learning process is complete and the oscillator tuning begins. As another example, if the determined density is 15%, and if the threshold difference condition is satisfied when the threshold difference is less than or equal to 6%, the state machine 205 may identify that there is no closest matching entry in the lookup table 400, and may reset the state machine 205 and/or generate an indication that a matching entry cannot be identified.

The oscillator calibrator 207 is similar to the oscillator calibrator 107. The oscillator calibrator 207 is configured to receive the control signal 215 and to send an oscillator control signal 211 for controlling the capacitance of the oscillator 209 to generate a re-timer clock signal 221 having a frequency that corresponds to the determined data rate. The oscillator calibrator 207 may be implemented using circuitry that selects capacitance values based on the control signal 215. For example, the oscillator calibrator 207 may include a multiplexer, where the inputs to the multiplexer are capacitance values, the control signal 215 is used to select a particular capacitance value for the oscillator control signal 211.

Referring back to FIG. 3, after the oscillator 209 has been calibrated to generate a re-timer clock signal 221 having a frequency that corresponds to the data rate determined by the state machine 205, the state machine 205 determines whether the input data signal 201 is frequency-locked with the re-timer clock signal 221 (305). In some implementations, the state machine 205 determines whether the input data signal 201 is frequency-locked with the re-timer clock signal 221 based on the frequency lock signal 217. If the state machine 205 determines that the input data signal 201 is not frequency-locked with the re-timer clock signal 221, the state machine 205 returns back to state SL0 attempt again to determine the data rate for the input data signal 201. As an example, with protocol 2, if the determined density is 48%, the state machine 205 may first identify that the closest matching entry is entry 405a, and determine that the target data rate is 5.4 Gbps. If the state machine 205 determines that the input data signal 201 is not frequency-locked with the re-timer clock signal 221 at 5.4 Gbps, the state machine 205 may move to learning state SL1 to verify whether the target half-rate of 2.7 Gbps meets the frequency lock threshold. If so, the state machine may move onto the next step. If header disambiguation is needed, the learning process continues to SL2 and SL3 to determine the target rate of the header received from input date signal 201. For example, if the target rate is the same for multiple entries (e.g., 407a, 407b, and 407c), the learning process may identify an entry based on information (e.g., preamble information) included the header.

Once the learning process is complete, if the state machine 205 determines that the input data signal 201 is frequency-locked with the re-timer clock signal 221, the state machine 205 moves through tuning state ST1 (306) to STx (307) to minimize the frequency difference between the input data signal 201 and the re-timer clock signal 221, where x is an integer.

In some implementations, the state machine 205 may fine tune the re-timer clock signal 221 through a dichotomy scheme. For example, at state ST1, the state machine 205 may increase or decrease a current capacitance value by a value $a_1$ to update the re-timer clock signal 221. In some implementations, the state machine 205 may increase or decrease a current capacitance value based on whether a frequency difference between the re-timer clock signal 221 and the input data signal 201 is a positive or a negative value. The frequency difference between the re-timer clock signal 221 and the input data signal 201 may be determined by the frequency comparator 203 or another phase detection circuitry.

After the re-timer clock signal 221 has been updated, if a frequency difference between the updated re-timer clock signal 221 and the input data signal 201 is smaller than the previous frequency difference, the state machine 205 moves to the next state ST2, where the state machine 205 may increase or decrease a current capacitance value by a value $a_2$ that is smaller than $a_1$ to further fine-tune the re-timer clock signal 221. The state machine 205 may continue the fine-tuning process until the state machine 205 reaches state STx. After the state machine 205 reaches state STx, the frequency difference between the re-timer clock signal 221 and the input data signal 201 is below a threshold, where the re-timer clock signal 221 may be used by another circuitry to sample data in the input data signal 201. The state machine 205 may continue to determine whether the frequency-lock has been maintained (309), and/or whether a reset signal has been received at the re-timer 200 (311). If the state machine 205 determines that the frequency-lock has been lost, or that a reset signal has been received, the state machine 205 returns to state S0.

The re-timer 200 may include circuitry that generates output data signal 251 based on the input data signal 201. For example, the re-timer 200 may include phase delay circuitry and buffer circuitry that adjust the phase of the data in the input data signal 201 to generate the output data signal 251, such that the phase of the data in the output data signal 251 aligns with the phase of the re-timer clock signal 221. The output data signal 251 and the re-timer clock signal 221 may be received by another circuitry (e.g., a decoder) that processes the data.

Figure 5:
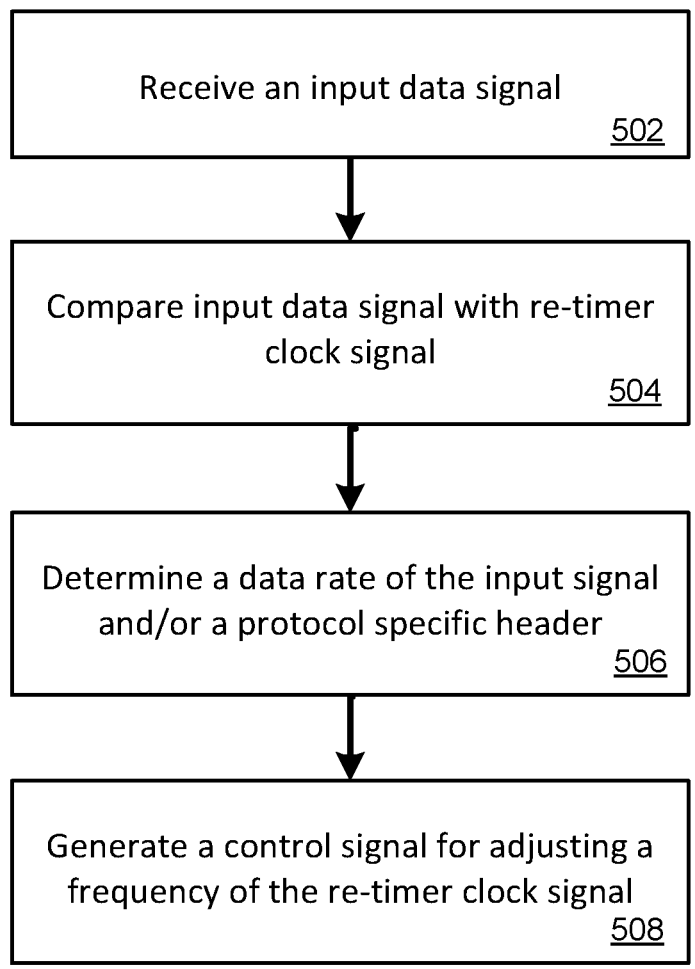
FIG. 5 is a flow diagram that illustrates an example of a process for generating a clock signal.

FIG. 5 is a flow diagram that illustrates an example of a process 500 for generating a clock signal. The process 500 may be performed by a re-timer, such as the re-timer 100 or the data processing machine 200 described above, or another apparatus.

The re-timer receives an input data signal transmitted without a reference clock signal (502). For example, the re-timer 200 may receive the input data signal 201. In some implementations, the re-timer receives a preamble portion of the input data signal. For example, the preamble portion may be a header of a data stream.

The re-timer compares the input data signal with a re-timer clock signal to determine a frequency difference between the input data signal and the re-timer clock signal (504). For example, the frequency comparator 203 is configured to compare the input data signal 201 and the re-timer clock signal 221 to determine a frequency difference between the input data signal 201 and the re-timer clock signal 221. In some implementations, the re-timer may receive a trigger signal. In response to receiving the trigger signal, the re-timer compares the input data signal with the re-timer clock signal to determine the frequency difference between the input data signal and the re-timer clock signal. For example, a data detector may detect that the input data signal 201 is received. In response to detecting that the input data signal 201 is received, the data detector transmits the start signal 237 to the clock counter 231 and the data edge counter 233 to trigger the counting.

In some implementations, the re-timer determines a number of data edge transitions of the input data signal that occur within a predetermined number of clock cycles of the re-timer clock signal. The re-timer then compares the number of data edge transitions of the input data signal with the predetermined number of clock cycles to determine the frequency difference between the input data signal and the re-timer clock signal. For example, the clock counter 231 provides a clock cycle count using the re-timer clock signal, and the data edge counter 233 provides a count of data edge transitions using the preamble data in the input data signal 201. Both counters 231 and 233 start at the same time and run concurrently until a predetermine data count is reached. After the predetermine data count is reached, the comparator 235 determines a density signal 213 of the input data signal 201 based on the outputs of the two counters 231 and 233 that represents the frequency difference.

In some implementations, the re-timer compares the number of data edge transitions of the input data signal with the predetermined number of clock cycles to determine a density of the input data signal. For example, during the time that the clock counter 231 has counted 4096 clock cycles using the re-timer clock signal 221, the data edge counter 233 has counted 1024 data rising edge transitions using the input data signal 201. The comparator 235 may determine the density of the input data signal 201 as 50%.

The re-timer determines a data rate of the input data signal based on the frequency difference between the input data signal and the re-timer clock signal (506). In some implementations, the re-timer determines the data rate of the input data signal based on the determined density of the input data signal. For example, the state machine 205 may be configured to receive the density signal 213 and the frequency lock signal 217, and to determine a data rate of the input data 201 based on a current state of the state machine 205, the density signal 213, and the frequency lock signal 217. In some implementations, the re-timer obtains the density of the preamble portion of the particular transmission scheme from a lookup table that stores density information associated with multiple transmission schemes. For example, the state machine 205 may determine the data rate based on the density of the input data signal 201 using a lookup table 400, where the lookup table 400 stores information for N different protocols. In some other implementations, the re-timer determines that a difference between the determined density of the input data signal and a density of a preamble portion of a particular transmission scheme satisfies a threshold condition. In response to determining that the difference between the determined density of the input data signal and the density of the preamble portion of the particular transmission scheme satisfies the threshold condition, the re-timer may assign a data rate of the particular transmission scheme to the input data signal. For example, if the determined density is 52%, the state machine 205 may identify that the closest matching entry is entry 405a, and determine that the target data rate is 5.4 Gbps.

The re-timer generates, based on the data rate of the input data signal, a control signal for adjusting a frequency of the re-timer clock signal to frequency-lock the re-timer clock signal with the input data signal (508). For example, after the state machine 205 determines the target data rate, the state machine 205 generates a control signal 215 to the VCO calibrator 207. The VCO calibrator 207 receives the control signal 215 and sends an oscillator control signal 211 for controlling the capacitance of the VCO 209 to generate a re-timer clock signal 221 having a frequency that corresponds to the determined data rate. In some implementations, the control signal is a capacitance calibration signal for driving a voltage-controlled oscillator. The re-timer can generate the control signal for adjusting the frequency of the re-timer clock signal to frequency-lock with the input data signal before receiving a data payload portion of the data signal. For example, the re-timer 200 may use preamble information of the input data signal 201 to calibrate the VCO 209 before the payload data portion of the input data signal 201 is received at the re-timer 200.

In some implementations, the re-timer generates a first control signal on a control signal line to generate a first frequency of the re-timer clock signal. For example, the state machine 205 may set an initial re-timer rate of 5 Gbps. The re-timer may determine a first frequency difference between the first frequency and a frequency of the input data signal. For example, the frequency comparator 203 may be configured to compare the input data signal 201 and the re-timer clock signal 221 to determine a frequency difference between the input data signal 201 and the re-timer clock signal 221.

The re-timer may generate, based on the first frequency difference, a second control signal on the control signal line to generate a second frequency of the re-timer clock signal having a second frequency difference between the second frequency and the frequency of the input data signal that is smaller than the first frequency difference. For example, based on the density information, the state machine 205 may use the lookup table 400 to determine a data rate and a protocol of the input signal 201. After the state machine 205 determines the target data rate, the state machine 205 generates a control signal 215 to the VCO calibrator 207 to generate a re-timer clock signal 221 having a frequency that corresponds to the determined data rate, where the updated frequency difference is smaller than the initial frequency difference.

Figure 6:
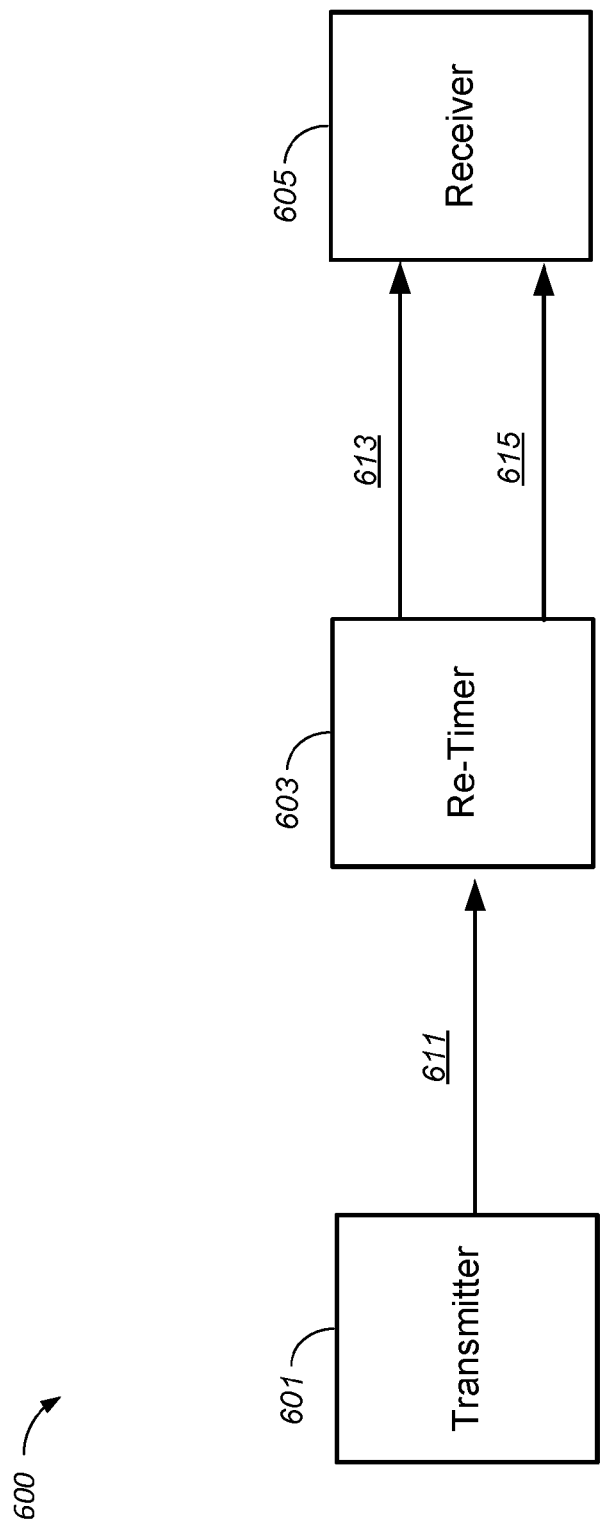
FIG. 6 is an example system.

FIG. 6 is an example system 600 that illustrates a system including a re-timer. The system 600 includes a transmitter 601, a re-timer 603, and a receiver 605. The transmitter 601 may be circuitry, a module, a component, a device, a system, or any suitable apparatus that is configured to transmit an input data signal 611 without a reference clock signal. In some implementations, the transmitter 601 may include an encoder that encodes the data in the input data signal 611. In some other implementations, the transmitter 601 may obtain the encoded data from another source (e.g., data stored in a memory device), and transmit the encoded data in the input data signal 611. The input data signal 611 is similar to the input data signal 101 or the input data signal 201.

The re-timer 603 is similar to the re-timer 100 or the re-timer 200. The re-timer 603 is configured to receive the input data signal 611 from the transmitter 601, and generate a re-timer clock signal 613 and an output data signal 615. The receiver 605 is configured to receive the re-timer clock signal 613 and the output data signal 615, and to process the data in the output data signal 615. For example, the receiver 605 may sample the data in the output data signal 615 using the re-timer clock signal 613, and then process the sampled data. In some implementations, the re-timer 603 and the receiver 605 may be different modules of a receiving system. For example, the receiving system may be a mobile device or computer system. In some other implementations, the re-timer 603 and the receiver 605 may be arranged in separate systems.

A number of embodiments of the invention have been described. Nevertheless, it will be understood that various modifications may be made without departing from the spirit and scope of the invention. Accordingly, other embodiments are within the scope of the following claims.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method for generating a clock signal using re-timer circuitry, the method comprising:
    receiving an input data signal transmitted without a reference clock signal;
    comparing the input data signal with a re-timer clock signal to determine a frequency difference between the input data signal and the re-timer clock signal;
    determining a data rate of the input data signal based on the frequency difference between the input data signal and the re-timer clock signal; and
    generating, based on the data rate of the input data signal, a control signal for adjusting a frequency of the re-timer clock signal to frequency-lock the re-timer clock signal with the input data signal.

2. The method of claim 1,
    wherein receiving the input data signal further comprises receiving a preamble portion of the input data signal.

3. The method of claim 2, wherein determining the frequency difference between the input data signal and the re-timer clock signal further comprises:
    determining a data edge density of the preamble portion of the input data signal using the re-timer clock signal; and
    determining the frequency difference between the input data signal and the re-timer clock signal based on the data edge density.

4. The method of claim 3, wherein determining the data rate of the input data signal further comprises determining the data rate of the input data signal based on the determined data edge density of the preamble portion of the input data signal and an expected data edge density based on the frequency of the re-timer clock signal.

5. The method of claim 4,
    wherein the expected data edge density is based on particular data rate of a particular transmission protocol;

wherein determining the data rate of the input data signal based on the determined data edge density of the preamble portion of the input data signal and the expected data edge density further comprises:

determining that a difference between the determined data edge density of the preamble portion of the input data signal and the expected data edge density satisfies a threshold condition; and in response to determining that the difference between the determined data edge density of the preamble portion of the input data signal and the expected data edge density satisfies the threshold condition, assigning the particular data rate of the particular transmission protocol to the input data signal.

6. The method of claim 5, further comprising:

in response to determining that the difference between the determined data edge density of the preamble portion of the input data signal and the expected data edge density satisfies the threshold condition, assigning the particular transmission protocol to the input data signal.

7. The method of claim 5, wherein determining that the difference between the determined data edge density of the preamble portion of the input data signal and the expected data edge density satisfies the threshold condition further comprises obtaining the expected data edge density from a lookup table that stores data edge density information associated with multiple transmission protocols.

8. The method of claim 7, wherein obtaining the expected data edge density from the lookup table further comprises:

determining, based on the preamble portion of the input data signal, that the input data signal was encoded based on the particular transmission protocol; and in response to determining that the input data signal was encoded based on the particular transmission protocol, obtaining the expected data edge density from the lookup table.

9. The method of claim 3, wherein determining the data edge density of the preamble portion of the input data signal using the re-timer clock signal further comprises determining a number of data edge transitions of the preamble portion of the input data signal that occur within a predetermined number of clock cycles of the re-timer clock signal.

10. The method of claim 2, wherein generating the control signal for adjusting the frequency of the re-timer clock signal further comprises generating the control signal for adjusting the frequency of the re-timer clock signal to frequency-lock with the input data signal before receiving a data payload portion of the data signal.

11. The method of claim 1, further comprising receiving a trigger signal, and wherein comparing the input data signal with the re-timer clock signal further comprises in response to receiving the trigger signal, comparing the input data signal with the re-timer clock signal to determine the frequency difference between the input data signal and the re-timer clock signal.

12. The method of claim 1, wherein generating a control signal for adjusting a frequency of the re-timer clock signal comprises:

generating a first control signal to generate a first frequency of the re-timer clock signal;

determining a first frequency difference between the first frequency and a frequency of the input data signal; and generating, based on the first frequency difference, a second control signal to generate a second frequency of the re-timer clock signal having a second frequency difference between the second frequency and the frequency of the input data signal that is smaller than the first frequency difference.

13. The method of claim 1, wherein the control signal is a capacitance calibration signal for driving a voltage-controlled oscillator.

14. An apparatus for generating a clock signal, the apparatus comprising:

frequency comparator circuitry configured to:

receive an input data signal transmitted without a reference clock signal; and compare the input data signal with a re-timer clock signal to determine a frequency difference between the input data signal and the re-timer clock signal;

a state machine configured to:

determine a data rate of the input data signal based on the frequency difference between the input data signal and the re-timer clock signal; and oscillator calibrator circuitry configured to:

generate, based on the data rate of the input data signal, a control signal for adjusting a frequency of the re-timer clock signal to frequency-lock the re-timer clock signal with the input data signal.

15. The apparatus of claim 14, wherein receiving the input data signal further comprises receiving a preamble portion of the input data signal.

16. The apparatus of claim 15, wherein determining the frequency difference between the input data signal and the re-timer clock signal further comprises:

determining, by the frequency comparator circuitry, a data edge density of the preamble portion of the input data signal using the re-timer clock signal; and determining, by the frequency comparator circuitry, the frequency difference between the input data signal and the re-timer clock signal based on the data edge density.

17. The apparatus of claim 16, wherein determining the data rate of the input data signal further comprises determining, by the state machine, the data rate of the input data signal based on the determined data edge density of the preamble portion of the input data signal and an expected data edge density based on the frequency of the re-timer clock signal.

18. The apparatus of claim 17, wherein the expected data edge density is based on particular data rate of a particular transmission protocol;

wherein determining the data rate of the input data signal based on the determined data edge density of the preamble portion of the input data signal and the expected data edge density further comprises:

determining, by the state machine, that a difference between the determined data edge density of the preamble portion of the input data signal and the expected data edge density satisfies a threshold condition; and in response to determining that the difference between the determined data edge density of the preamble portion of the input data signal and the expected data edge density satisfies the threshold condition, assigning, by the state machine, the particular data rate of the particular transmission protocol to the input data signal.

19. The apparatus of claim 18, wherein the state machine is further configured to:

in response to determining that the difference between the determined data edge density of the preamble portion of the input data signal and the expected data edge density satisfies the threshold condition, assign the particular transmission protocol to the input data signal.

20. The apparatus of claim 18, wherein determining that the difference between the determined data edge density of the preamble portion of the input data signal and the expected data edge density satisfies the threshold condition further comprises obtaining, by the state machine, the expected data edge density from a lookup table that stores data edge density information associated with multiple transmission protocols.

21. The apparatus of claim 20, wherein obtaining the expected data edge density from the lookup table further comprises:
determining, by the state machine and based on the preamble portion of the input data signal, that the input data signal was encoded based on the particular transmission protocol; and
in response to determining that the input data signal was encoded based on the particular transmission protocol, obtaining the expected data edge density from the lookup table.

22. The apparatus of claim 16, wherein determining the data edge density of the preamble portion of the input data signal using the re-timer clock signal further comprises determining, by the frequency comparator circuitry, a number of data edge transitions of the preamble portion of the input data signal that occur within a predetermined number of clock cycles of the re-timer clock signal.

23. The apparatus of claim 15,
wherein generating the control signal for adjusting the frequency of the re-timer clock signal further comprises generating, by the oscillator calibrator circuitry, the control signal for adjusting the frequency of the re-timer clock signal to frequency-lock with the input data signal before receiving a data payload portion of the data signal.

24. The apparatus of claim 14,
wherein the frequency comparator circuitry is configured to receive a trigger signal, and
wherein comparing the input data signal with the re-timer clock signal further comprises in response to receiving the trigger signal, comparing the input data signal with the re-timer clock signal to determine the frequency difference between the input data signal and the re-timer clock signal.

25. The apparatus of claim 14, wherein generating a control signal for adjusting a frequency of the re-timer clock signal comprises:
generating, by the oscillator calibrator circuitry, a first control signal to generate a first frequency of the re-timer clock signal;
determining, by frequency comparator circuitry, a first frequency difference between the first frequency and a frequency of the input data signal; and
generating, by the oscillator calibrator circuitry and based on the first frequency difference, a second control signal to generate a second frequency of the re-timer clock signal having a second frequency difference between the second frequency and the frequency of the input data signal that is smaller than the first frequency difference.

26. The apparatus of claim 14, wherein the control signal is a capacitance calibration signal for driving a voltage-controlled oscillator.

27. An apparatus for generating a clock signal, the apparatus comprising:
a state machine configured to:
obtain information representing a frequency difference between (i) an input data signal that has been transmitted without a reference clock signal and (ii) a re-timer clock signal generated using the apparatus;
determine a data rate of the input data signal based on the frequency difference between the input data signal and the re-timer clock signal; and
output a control signal for adjusting a frequency of the re-timer clock signal to frequency-lock the re-timer clock signal with the input data signal.

28. The apparatus of claim 27, wherein determining the data rate of the input data signal further comprises:
determining the data rate of the input data signal based on a data edge density of a preamble portion of the input data signal and an expected data edge density based on the frequency of the re-timer clock signal.

29. A system comprising:
a communication system configured to receive an input data signal, the communication system including a receiver and a re-timer, wherein the re-timer is configured to:
receive the input data signal without a reference clock signal;
compare the input data signal with a re-timer clock signal to determine a frequency difference between the input data signal and the re-timer clock signal;
determine a data rate of the input data signal based on the frequency difference between the input data signal and the re-timer clock signal; and
generate, based on the data rate of the input data signal, a control signal for adjusting a frequency of the re-timer clock signal to frequency-lock the re-timer clock signal with the input data signal.

30. A system comprising:
a re-timer configured to:
receive an input data signal without a reference clock signal;
compare the input data signal with a re-timer clock signal to determine a frequency difference between the input data signal and the re-timer clock signal;
determine a data rate of the input data signal based on the frequency difference between the input data signal and the re-timer clock signal; and
generate, based on the data rate of the input data signal, a control signal for adjusting a frequency of the re-timer clock signal to frequency-lock the re-timer clock signal with the input data signal; and
a receiver configured to:
receive the re-timer clock signal; and
process the input data signal based on the re-timer clock signal.

* * * * *